FIELD EFFECT SEMICONDUCTOR DEVICE HAVING CHANNEL STOPPING MEANS

Filed Oct. 25, 1967

INVENTORS
YASUFUSA SHIMA
KAZUO KOBAYASHI

BY Craig & Antonelli
ATTORNEYS

United States Patent Office 3,506,890

Patented Apr. 14, 1970

3,506,890

FIELD EFFECT SEMICONDUCTOR DEVICE HAVING CHANNEL STOPPING MEANS

Yasufusa Shima, Kodaira-shi, and Kazuo Kobayashi, Tokyo, Japan, assignors to Hitachi, Ltd., Tokyo, Japan, a corporation of Japan Filed Oct. 25, 1967, Ser. No. 677,912
Claims priority, application Japan, Oct. 31, 1966, 41/100,318
Int. Cl. H01l *11/00, 5/00*
U.S. Cl. 317—235 7 Claims

ABSTRACT OF THE DISCLOSURE

A junction-type field effect transistor having an n-type region (the region providing a source and a drain region, and a carrier path) formed in the surface of a p-type silicon substrate, a $p^+$-type region (a gate region) formed in the n-type region, and an insulating film covering the substrate surface including the exposed portion of the pn junction. In the transistor, the high-doped $p^+$ gate region extends between opposite extremities of the substrate across the n-type source and drain regions, and the insulating film is partly removed to expose the substrate surface so that the exposed portions surround the n-type region and intersect the extended $p^+$-type region.

BACKGROUND OF THE INVENTION

This invention relates to a field effect semiconductor device and more particularly to a junction-type field effect transistor.

It is commonly known that, when the surface of a semiconductor is covered with a film of an electrical insulator such as a silicon oxide, the state of energy at the above surface is varied by the presence of the insulating film. When, for example, a silicon oxide film about 5,000 A. thick is formed on the surface of a low-doped p-type silicon substrate having an impurity concentration of $10^{15}$ to $10^{16}$ atoms per cubic centimeter, the substrate surface portion lying directly beneath the silicon oxide film has its electron density apparently increased and is thereby inverted to the opposite type or n-type. Such a phenomenon is called the channel effect.

Although the above phenomenon may be advantageously utilized in some cases, this phenomenon generally gives rise to an undesirable short-circuit trouble, a high leakage current, a reduction in the breakdown voltage, an unstability in the operating characteristics, etc. in many semiconductor devices.

Such phenomenon is also objectionable for a junction-type field effect transistor since the channel effect is the major cause of the deterioration of the electrical properties of the transistor including a lowered output impedance, a reduced breakdown voltage and a reduced reliability. Although many proposals were made heretofore in an attempt to avoid the occurrence of the objectionable channel effect, it is believed that any excellent measures that can be effectively applied to a junction-type field effect transistor have not yet been proposed prior to the present invention.

SUMMARY OF THE INVENTION

It is therefore the primary object of the present invention to provide a field effect semiconductor device, more especially a junction-type field effect transistor which is entirely free from the adverse effect attributable to the induced inverted surface layer.

Another object of the present invention is to provide a junction-type field effect transistor which has a reduced source-to-drain leakage current, and thus has a high output impedance.

A further object of the present invention is to provide a method of easily mass-producing a junction-type field effect transistor having excellent electrical properties.

In accordance with one embodiment of the present invention, a $p^+$-type high-doped region extending between the opposite extremities of a substrate of a first conductivity type across a region of a second conductivity type which is formed in one principal surface of the substrate of the first conductivity type covered with an electrically insulating film and includes therein a source region, a drain region and a carrier path, and an exposed surface portion or insulating film-free portions of the substrate which intersects the high-doped region on the above principal surface and surrounds the region of the second conductivity type in a spaced relation therefrom, are provided to isolate the detrimental inverted channel which acts to cause short-circuit between the source region and the drain region or to increase the leakage current at the gate junction.

DESCRIPTION OF THE PREFERRED EMBODIMENT

Figure 1:
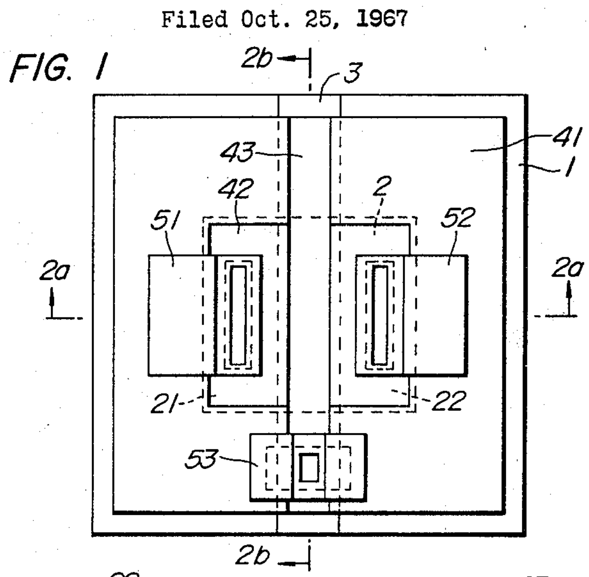
FIG. 1 is a top plan view of an embodiment of the junction-type field effect transistor according to the present invention.
Figure 2A:
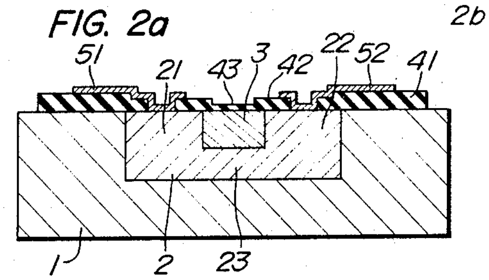
FIGS. 2*a* and 2*b* are sectional views taken on the lines 2*a*—2*a* and 2*b*—2*b* in FIG. 1, respectively.
Figure 2B:
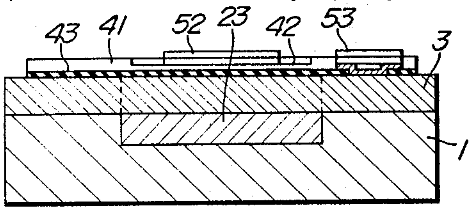

Referring first to FIGS. 1, 2*a* and 2*b*, an embodiment of the present invention will be described. The junction-type field effect transistor comprises a p-type silicon substrate 1 having a specific resistance in the order of 1 to 5 Ω-cm. Beneath one of the principal surfaces of the silicon substrate 1, there are formed an n-type semiconductor region 2 which is isolated from the substrate 1 by a pn junction, and a $p^+$-type region 3 which extends between the opposite extremities of the substrate 1 across the substantially central portion of the n-type region 2 and is isolated from the n-type region 2 by a second pn junction. The n-type semiconductor region 2 is formed by doping with an inpurity such as antimony and has a surface impurity concentration in the order of $10^{16}$ atoms per cubic centimeter and a depth in the order of 2 microns. The $p^+$-type region 3 is formed by doping with an impurity such as boron and has a surface impurity concentration in the order of $10^{19}$ atoms per cubic centimeter and a depth in the order of 1 micron. On the principal surface of the substrate 1, there are silicon oxide films 41, 42 and 43 about 5,000 A. thick which are so disposed as to cover especially those portions of the pn junctions exposed on the principal surface of the substrate 1 as well as the surfaces of the n-type and $p^+$-type regions. An opening is bored through a portion of the oxide film 43 on the $p^+$-type region (the gate region) 3 and an electrode metal is deposited through the opening to provide a gate electrode 53 which is ohmically connected with a portion of the $p^+$-type region 3 exposed through the opening. In FIG. 1, the ohmic contact portion between the gate electrode 53 and the $p^+$-type region 3 is shown by hatched lines. A source region 21, a drain region 22 and a carrier path 23 are defined in the n-type region 2 by the p-type substrate 1 and the high-doped $p^+$-type region 3. As in the case of the deposition of the gate electrode, openings are bored through portions of the oxide film 42 covering the source region 21 and the drain region 22, and an electrode metal is deposited through the openings to provide a source electrode 51 and a drain electrode 52 which are ohmically connected with the source region 21 and the drain region 22, respectively. The oxide films are removed along the periphery of the substrate 1, and the removed portions intersect the $p^+$-type gate region 3 as shown.

An especially important feature in the above structure resides in the fact that the high-doped gate region 3 extends to the peripheral portions of the substrate 1 which are not covered with the oxide films, that is, the portions which are free from the presence of the inverted channel. The gate region 3 has a surface impurity concentration in the order of $10^{19}$ atoms per cubic centimeter in the semiconductor region 2 of the second conduction type as described above, but its concentration at the substrate surface is substantially as high as $10^{19}$ atoms per cubic centimeter and such a concentration is high enough to prevent the formation of the inverted channel. Accordingly, in contrast to the prior trouble in which the inverted channel caused short-circuit between the source and the drain, and in which an increase in the effective junction area due to the presence of the inverted layer resulted in an increase in the leakage current between the gate and the source, the cooperative action between the extended gate region 3 and the film-free portions at the periphery of the substrate surface in the present invention was so effective as to localize the formation of the inverted layer, with the result that the short-circuit between the source and the drain was entirely eliminated and an appreciable reducion in the leakage current between the gate and the source could be attained.

Such a field effect transistor can, for example, be obtained easily with a high degree of mass producibility by a method comprising the steps of preparing a p-type silicon substrate, employing a silicon oxide film as a diffusion mask and applying the well-known selective diffusion technique to form in one of the principal surfaces of the silicon substrate an n-type region and a $p^+$-type high-doped region extending across the n-type region to the periphery of the substrate, and then applying the photo-etching technique to simultaneously remove those portions of the silicon oxide film corresponding to the respective positions of the electrodes as shown in FIG. 1 and those silicon oxide film portions surrounding the surface of the semiconductor region of the second conductivity type also as shown in FIG. 1.

The above description has referred to the manufacture of a junction-type field effect transistor from a single substrate for the sake of convenience of explanation, but the actual process for the manufacture of junction-type field effect transistors is such that a silicon bar obtained by the Czochralski's method or the like is cut into thin silicon wafers, and the treatment as described above is simultaneously applied to these silicon wafers, finally a multiplicity of pellets each including therein a junction-type field effect transistor as shown in FIG. 1 being cut from each wafer to mass-produce the junction-type field effect transistors. Therefore, the removal of the silicon oxide film described previously has an important significance in that the layer inverted in its conductivity type does not extend to the side faces of the pellet. More precisely, the film removal has a great significance because the side faces of the pellet mechanically cut from the wafer involve many crystallographical defects, and the exposure of the inverted layer (which is continuous with the source and the drain) gives rise to deterioration of the electrical properties of the transistor.

In the above-mentioned mass-production method of the transistor, the area free from the silicon oxide film is formed first in the pattern of a lattice over the wafer, and then the wafer may be cut (or scribed, as so called in the industry) along the lattice into the individual pellets, thus said area devoid of silicon oxide being conveniently used as a mark for cutting operation.

In the above embodiment, the silicon oxide film is removed at the periphery of the pellet in such a manner as to surround the semiconductor region of the second conductivity type, but it will be understood that the removal of the silicon oxide film is in no way limited to the periphery of the pellet, and the silicon oxide film may be removed at any desired portions so long as the silicon oxide film is removed in such a manner that the removed portions surround the semiconductor region of the second conductivity type and intersect the $p^+$-type high-doped region.

The disposition of the gate electrode 53 so as to overlie the surface of the high-doped gate layer in the vicinity of the gate as shown in FIG. 1 is quite effective to provide a good ohmic contact between the electrode metal and the semiconductor and to reduce the series resistance component encountered by the current flowing from the gate electrode 53 to the gate region 3. If so required, a plurality of $p^+$-type regions may be formed in such a manner as to extend transversely through the semiconductor region of the second conductivity type in the embodiment described above to thereby obtain a device having the source, drain and gate regions of comb-like shape.

Figure 3:
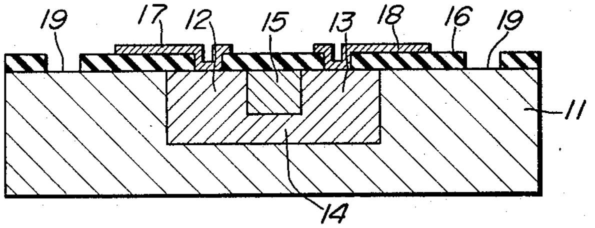
FIG. 3 is a sectional view of another embodiment of the junction-type field effect transistor according to the present invention.

In FIG. 3, there is shown a section of another embodiment of the junction-type field effect transistor according to the present invention. The junction-type field effect transistor shown in FIG. 3 comprises a p-type substrate 11, an n-type region disposed in the principal surfaces of the substrate 11 and including therein a source region 12, a drain region 13 and a carrier path 14, and a $p^+$-type region 15 extending substantially to the periphery of the pellet and intersecting an annular groove 19 formed in the vicicity of the periphery of the pellet.

The above structure may be obtained according to a process as described with regard to the preceding embodiment. However, in another method for fabrication of the transistor, the thermally formed silicon oxide film covering the principal surface of the substrate may be removed after the above structure has been made, and in lieu of such oxide film, a new silicon oxide film 16 may be deposited as shown in FIG. 3 by the thermal decomposition of organic silane in an oxidizing atmosphere at a temperature above 700° C. but below 800° C. Openings are bored through the deposited oxide film 16 to expose portions of the substrate surface for the deposition of electrodes and for the isolation of the inverted layer. Aluminum is then evaporated to cover the exposed substrate surface portions and the entire surface of the oxide film 16. The aluminum coating is then entirely removed except those portions covering the source region 12, the drain region 13 and the gate region 15 to thereby provide a source electrode 17, a drain electrode 18 and a gate electrode (not shown) as shown in FIG. 3. The electroytic etching technique may be employed for the removal of the aluminum coating. The annular groove 19 is also formed in the above step.

The pellet shown in FIG. 3 is shown in a state after it has been cut from a wafer, and it will be seen from FIG. 3 that the groove 19 is formed adjacent to the periphery of the pellet and any silicon oxide film which induces the undesirable channel does not exist at those portions. The $p^+$-type gate region 15 extends substantially to the opposite side faces of the pellet and thereby acts to relieve the junction-type field effect transistor from the objectionable channel effect as in the case of the preceding embodiment.

Figure 4:
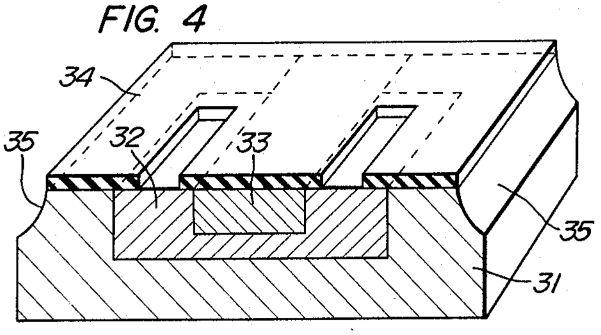
FIG. 4 is a sectional view of a further embodiment of the junction-type field effect transistor according to the present invention.

In FIG. 4, there is shown in a perspective fashion a section of a further embodiment of the junction-type field effect transistor according to the present invention. The junction-type field effect transistor shown in FIG. 4 comprises a p-type substrate 31 which includes therein an n-type region 32 and a $p^+$-type gate region 33. The surfaces of the substrate 31, the n-type region 32 and the $p^+$-type region 33 are covered with a silicon oxide film 34 except those portions at which the electrodes are to be deposited. In this embodiment, the pellet is cut in such a manner that the extended gate region 33 intersects a deeply etched peripheral groove 35 for thereby isolating the inverted layer by the high-doped gate region and by those portions of the side faces of the pellet where the oxide film, hence, the inverted layer does not exist.

Incidentally, a film of silicon nitride ($Si_3N_4$) or of glass containing an oxide of boron, phosphorus or lead may be employed in lieu of or in cooperation ith the silicon oxide film described above for the stabilization of the surface state of the transistor for thereby further enhancing the advantage of the present invention. Moreover, although the embodiments described above have exclusively referred to a case in which the gate region is extended to the periphery of the semiconductor substrate, the gate region may not be so extended and the area of the film-free portions may be enlarged to such an extent that these portions extend to the gate region but do not expose the junctions.

Furthermore those portions of the $p^+$-type high-doped region which serve to prevent the formation of the inverted channel and the remaining portion of the $p^+$-type high-doped region which serves as the gate may be separately provided.

What is claimed is:

1. A field effect semiconductor device comprising:

a semiconductor substrate of a first conductive type having a principal surface and side surfaces having crystallographic defects;

a first semiconductor region of a second conductivity type formed in said principal surface of said substrate and spaced apart from said side surfaces;

a second, elongated semiconductor region of the first conductivity type disposed in said principal surface of said substrate so as to divide the surface of said first semiconductor region into two portions and having a depth shallower than the depth of said first semiconductor region, the end portions of said second semiconductor region extending beyond the periphery of said first semiconductor region so as to terminate at said side surfaces of said substrate;

an electrically insulating film covering at least the exposed portion of a pn junction formed between said semiconductor substrate and said first semiconductor region; and said principal surface of said substrate being exposed at a portion thereof surrounding and spaced apart from said first semiconductor region and intersecting both of the extending end portions of said second semiconductor region, said second semiconductor region having a sufficiently high impurity concentration at the portion thereof lying directly beneath said insulating film to prevent the formation of an inverted layer of the opposite conductivity type which is induced by said insulating film.

2. A field effect semiconductor device according to claim 1, in which said first conductivity type is the p-type, said second conduction type is the n-type, and said insulating film consists of a silicon compound.

3. A junction-type field effect transistor comprising:

a semiconductor body of a first conductivity type having a principal surface and side surfaces being rich in crystallographic defects;

a source region and a drain region each of a second conductivity type opposite to said first conductivity type formed in said principal surface and spaced apart from each other and from said side surfaces;

a channel region of said second conductivity type buried in said body to connect said source region with said drain region;

a heavily doped region of said first conductivity type extending in said principal surface of said body from one side surface to another side surface to overlie said channel region between said source and drain regions; and an insulating film formed on said principal surface of said body to cover at least the end portions of the pn junctions formed between said source and drain regions and the adjacent semiconductor material of said first conductivity type, a part of said principal surface of said body being exposed so that the exposed part surrounds and is spaced apart from said source and drain regions and intersects said heavily doped region.

4. The semiconductor device according to claim 1, wherein said second semiconductor region is formed in a comb-like shape in said first semiconductor region.

5. The transistor according to claim 3, wherein said insulating film consists substantially of a material selected from the group consisting of silicon oxide, silicon nitride, glass containing boron oxide, glass containing phosphorous oxide and glass containing lead oxide.

6. A junction-type field effect transistor comprising:

a semiconductor body of a first conductivity type having a major surface;

a source region and a drain region each of a second conductivity type opposite to said first conductivity type formed in said major surface and space apart from each other and the periphery of said body;

a channel region of said second conductivity type buried in said body to connect said source region with said drain region;

a heavily doped region of said first conductivity type extending in said major surface of said body from one portion of the periphery of said body to the opposing portion of the periphery of said body to overlie said channel region between said source and drain regions; and an insulating film covering said major surface of said body and having a groove exposing a portion of the body surrounding said source and drain regions and intersecting said heavily doped region.

7. A junction-type field effect transistor comprising:

a semiconductor body of a first conductivity type having a major surface and side surfaces being rich in crystallographic defects;

a source region and a drain region each of a second conductivity type opposite to said first conductivity type formed in said major surface and spaced apart from each other and from said side surfaces;

a channel region of said second conductivity type buried in said body to connect said source region with said drain region;

an insulating film covering said major surface of said body; and a heavily doped region of said first conductivity type extending in said major surface of said body from one side surface to another side surface to overlie said channel region between said source and drain regions, the periphery of said body being mesa-shaped and exposed so that the mesa-shaped and exposed portion of the body completely surrounds said source and drain regions and intersects said heavily doped region to isolate the surfaces of said sources and drain regions from said side surfaces including the crystallographic defects.

References Cited

UNITED STATES PATENTS

| | | | |
|---|---|---|---|
| 3,293,087 | 12/1966 | Porter | 148—175 |
| 3,366,802 | 1/1968 | Hilbiber | 307—251 |
| 3,328,601 | 6/1967 | Rosenbaum | 307—88.5 |
| 3,226,611 | 12/1965 | Haenichen | 317—234 |

OTHER REFERENCES

Von Muench et al., I.B.M. Tech. Discl. Bull., vol 10, No. 3, Aug. 3, 1967, page 335.

JAMES D. KALLAM, Primary Examiner

M. H. EDLOW, Assistant Examiner

U.S. Cl. X.R.

317—234